US012588162B2

(12) United States Patent
Keehn et al.

(10) Patent No.: US 12,588,162 B2
(45) Date of Patent: Mar. 24, 2026

(54) ENHANCED FLUID REPLACEMENT STRUCTURES FOR USE IN IMMERSION COOLING TANKS

(71) Applicant: Microsoft Technology Licensing, LLC, Redmond, WA (US)

(72) Inventors: Nicholas Andrew Keehn, Kirkland, WA (US); Husam Atallah Alissa, Redmond, WA (US); Bharath Ramakrishnan, Bellevue, WA (US); Martha Geoghegan Peterson, Woodinville, WA (US); Eric Clarence Peterson, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 549 days.

(21) Appl. No.: 17/566,483

(22) Filed: Dec. 30, 2021

(65) Prior Publication Data
US 2023/0217626 A1     Jul. 6, 2023

(51) Int. Cl.
*H05K 7/20*     (2006.01)
*H01L 23/44*     (2006.01)

(52) U.S. Cl.
CPC ......... *H05K 7/20236* (2013.01); *H01L 23/44* (2013.01); *H05K 7/20272* (2013.01);
(Continued)

(58) Field of Classification Search
CPC .............. H05K 7/20236; H05K 7/203; H05K 7/20781; H05K 7/20772; H05K 7/20818; H05K 7/20272; H01L 23/44; H01L 23/473
See application file for complete search history.

(56) References Cited

U.S. PATENT DOCUMENTS 5,268,815 A * 12/1993 Cipolla ................. H05K 7/023
257/713
2019/0045661 A1     2/2019 Broderick et al.
(Continued)

FOREIGN PATENT DOCUMENTS

CN        213694613 U     7/2021
WO        2022005556 A1     1/2022

OTHER PUBLICATIONS

"International Search Report and Written Opinion Issued in PCT Application No. PCT/US22/044468", Mailed Date: Mar. 14, 2023, 21 Pages.
(Continued)

*Primary Examiner* — Zachary Pape
(74) *Attorney, Agent, or Firm* — Ray Quinney & Nebeker P.C.; James S. Bullough

(57) ABSTRACT

Fluid replacement structures used in immersion cooling tanks can include various enhancements to make them functional beyond simply taking up space. For example, the density of fluid replacement structures can be variable to assist with buoyancy control. As another example, fluid replacement structures can be designed to enable vaporized working fluid to be directed to a desired location. As another example, fluid replacement structures can include emergency cooling features, such as different substances that cause an endothermic reaction to occur when they are mixed together. The substances can be separated by a membrane that melts when the temperature reaches a certain point. As another example, a fluid replacement structure can provide structural support for an immersion cooling tank when negative pressure operations are performed. Fluid replacement structures can also include alignment features, lifting features, locking features, mating guides, fiducial markers, or the like.

20 Claims, 13 Drawing Sheets

(52) U.S. Cl.
CPC ......... *H05K 7/203* (2013.01); *H05K 7/20772*
(2013.01); *H05K 7/20809* (2013.01)

(56) References Cited

U.S. PATENT DOCUMENTS

| | | | |
|---|---|---|---|
| 2019/0281727 A1 | 9/2019 | Fujiwara et al. | |
| 2020/0323108 A1 | 10/2020 | Bilan et al. | |
| 2021/0410319 A1* | 12/2021 | Manousakis | ....... H05K 7/20818 |

OTHER PUBLICATIONS

"Invitation to Pay Additional Fees Issued in PCT Application No.
PCT/US22/044468", Mailed Date: Jan. 20, 2023, 14 Pages.

* cited by examiner

ENHANCED FLUID REPLACEMENT STRUCTURES FOR USE IN IMMERSION COOLING TANKS

CROSS-REFERENCE TO RELATED APPLICATIONS

N/A

BACKGROUND

Computer cooling is the process of removing waste heat generated by system components within a computer system to keep components within permissible operating temperature limits. Cooling can be important because computer components are susceptible to temporary malfunction or permanent failure if they are overheated.

Some datacenters utilize immersion cooling techniques in which computing devices are submerged in a thermally conductive, electrically isolating dielectric fluid, which may be referred to as a working fluid or a heat transfer fluid. In an immersion cooling system, at least one container (e.g., a tank) is filled with the working fluid, and computing devices are placed in the container. The container may be referred to herein as an immersion cooling tank. The working fluid has a higher heat capacity than air requiring less fluid volume for a given heat load. Heat is removed from the computing devices by circulating the working fluid into direct contact with hot components, then through heat exchangers where the waste heat is transferred to ultimately be rejected to the external environment. Fluids suitable for immersion cooling have very good insulating properties to ensure that they can safely come into contact with energized electronic components without significantly altering the electrical characteristics of the system or system components. Immersion cooling has the potential to become a popular cooling solution for datacenters because it allows operators to drastically reduce their energy usage through the elimination of the air cooling infrastructure.

Broadly speaking, there are two different types of immersion cooling techniques: single-phase immersion cooling and two-phase immersion cooling.

With a single-phase immersion cooling system, the working fluid never changes state and always remains in a liquid form. In some implementations, the working fluid may be actively circulated by pumping the dielectric coolant in, through, and around the computing devices being cooled, and then transferring the heat absorbed by the coolant to a heat rejection device such as a radiator, dry cooler, liquid-to-liquid heat exchanger, or cooling tower. Alternatively, the working fluid may be passively circulated by the natural convection of the heated coolant to the heat rejection device(s).

In a two-phase immersion cooling system, the heat of vaporization and the specific heat capacity characteristics of the work fluid are utilized for cooling. The working fluid generally has a relatively low boiling point such that heat absorbed by the fluid surrounding the computing devices causes a portion of the working fluid to boil off or vaporize into a gas, thereby enabling the phase change of the working fluid to carry heat away from the computing devices. The vapors produced by the boiling of the working fluid rise above the fluid pool where they contact a condenser that is cooler than the working fluid's boiling point. This causes the vapors to condense back into a liquid and fall back into the fluid pool.

The subject matter in the background section is intended to provide an overview of the overall context for the subject matter disclosed herein. The subject matter discussed in the background section should not be assumed to be prior art merely as a result of its mention in the background section. Similarly, a problem mentioned in the background section or associated with the subject matter of the background section should not be assumed to have been previously recognized in the prior art.

SUMMARY

In some embodiments, a fluid replacement structure for use in an immersion cooling tank that is configured to retain dielectric working fluid and that is also configured to retain a plurality of computing devices that are submerged in the dielectric working fluid includes a first portion that is configured to be attached to a first portion of a computing device. The first portion of the fluid replacement structure has a first density. A second portion is configured to be attached to a second portion of the computing device. The second portion of the fluid replacement structure has a second density that is greater than the first density. The second portion of the fluid replacement structure is positioned beneath the first portion of the fluid replacement structure when the fluid replacement structure and the computing device are placed in the immersion cooling tank.

At least one connector attaches to a mating connector in the immersion cooling tank to secure the fluid replacement structure and the computing device to the immersion cooling tank.

In some embodiments, a fluid replacement structure for use in an immersion cooling tank that is configured to retain dielectric working fluid and that is also configured to retain a plurality of computing devices that are submerged in the dielectric working fluid includes a side portion that is configured to be directly attached to a motherboard of a computing device. The motherboard also includes a first heat-generating component, a body portion, and a chamber in the body portion of the fluid replacement structure. The first heat-generating component is located in the chamber when the fluid replacement structure is attached to the motherboard. A channel is located in the body portion of the fluid replacement structure, the channel being configured to direct vaporized working fluid away from the first heat-generating component to an outer portion of the fluid replacement structure when the motherboard is submerged in the dielectric working fluid and the first heat-generating component is in operation.

In some embodiments, a fluid replacement structure for use in an immersion cooling tank that is configured to retain dielectric working fluid and that is also configured to retain a plurality of computing devices that are submerged in the dielectric working fluid, the plurality of computing devices comprising components that have a thermal limit for safe operation includes a first chamber, a second chamber, and a membrane separating the first chamber and the second chamber. The membrane has a melting point that is greater than a boiling point of the dielectric working fluid and less than the thermal limit of the components in the plurality of computing devices. A first substance is located within the first chamber. A second substance is located within the second chamber, wherein melting of the membrane causes the first substance to mix with the second substance. Mixing the first substance and the second substance causes an endothermic reaction to occur that lowers a temperature of the dielectric working fluid in the immersion cooling tank.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which:

FIG. 6-2 illustrates another example of a fluid replacement structure that directs working fluid to a desired location.

DETAILED DESCRIPTION

Fluid replacement structures are sometimes used in immersion cooling tanks. Up to this point, the purpose of these fluid replacement structures has been to occupy space in an immersion cooling tank in order to reduce the amount of dielectric working fluid that is needed to fill the tank. Using fluid replacement structures in this way can be beneficial because dielectric working fluid is expensive, and reducing the amount of dielectric working fluid that is required can reduce the cost of operating an immersion cooling tank. However, the present disclosure is generally related to various enhancements for fluid replacement structures to make them functional beyond simply taking up space and reducing the amount of dielectric working fluid that needs to be used.

One aspect of the present disclosure is related to designing fluid replacement structures so that they can assist with buoyancy control. In some embodiments, the density of the fluid replacement structures can be adjustable or variable. As will be explained in greater detail below, having fluid replacement structures with variable density can make it easier to place computing devices in an immersion cooling tank than it otherwise would be if the fluid replacement structures had uniform density.

Figure 1A:
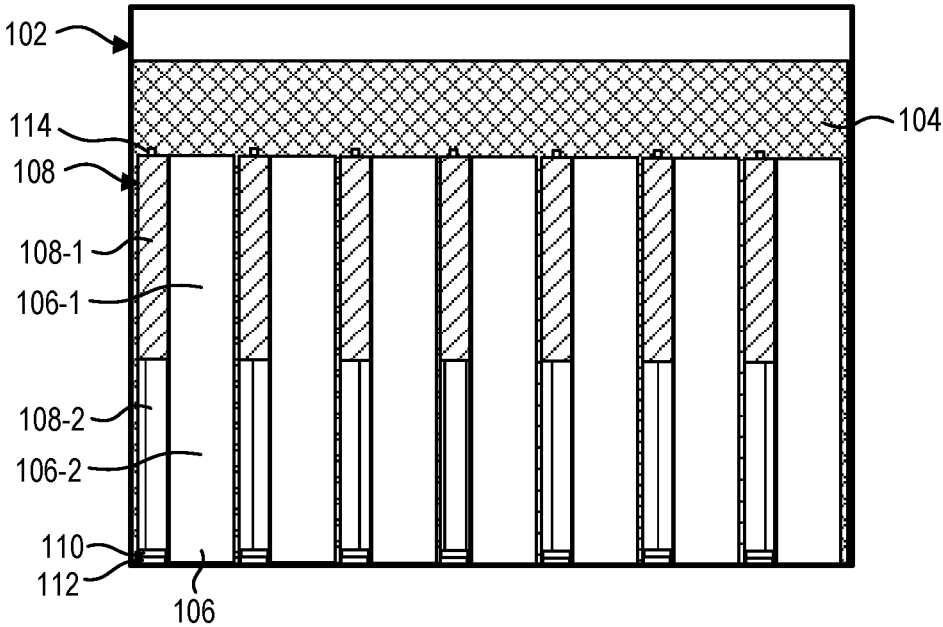
FIG. 1A illustrates an example of an immersion cooling tank that includes a plurality of fluid replacement structures with variable density.

FIG. 1A illustrates an example of an immersion cooling tank 102 that can be used in an immersion cooling system. The immersion cooling tank 102 can be designed for use in a single-phase immersion cooling system or a two-phase immersion cooling system.

The immersion cooling tank 102 is configured to retain dielectric working fluid 104. The immersion cooling tank 102 can be mostly filled with the dielectric working fluid 104. The immersion cooling tank 102 is also configured to retain a plurality of computing devices 106 that are submerged in the dielectric working fluid 104. In some embodiments, the computing devices 106 may be servers (e.g., blade servers) that are frequently stored and operated in datacenters.

The immersion cooling tank 102 includes a plurality of fluid replacement structures 108. In the depicted embodiment, the fluid replacement structures 108 are illustrated as rectangular blocks. However, fluid replacement structures may be shaped differently in accordance with the present disclosure. For example, fluid replacement structures may be triangular, circular, trapezoidal, etc.

One purpose of the fluid replacement structures 108 is to occupy space in the immersion cooling tank 102 in order to reduce the amount of dielectric working fluid 104 that is needed to fill the immersion cooling tank 102. However, in accordance with the present disclosure, the fluid replacement structures 108 are enhanced with additional features that make them functional beyond simply taking up space and reducing the amount of dielectric working fluid 104 that needs to be used.

The fluid replacement structures 108 have variable density. In the depicted embodiment, each fluid replacement structure 108 has a first portion 108-1 that has a first density and a second portion 108-2 that has a second density. The density of the second portion 108-2 of the fluid replacement structures 108 can be greater than the density of the first portion 108-1 of the fluid replacement structures 108. As noted above, having variable density between the fluid replacement structures enables convenient placement of the computing device in an immersion cooling tank.

In the depicted embodiment, each fluid replacement structure 108 is designed so that the first portion 108-1 of the fluid replacement structure 108 is configured to be attached to a first portion 106-1 of a computing device 106, and the second portion 108-2 of the fluid replacement structure 108 is configured to be attached to a second portion 106-2 of the computing device 106. Therefore, when a computing device 106 and the corresponding fluid replacement structure 108 are placed in the immersion cooling tank 102 and submerged in the dielectric working fluid 104, the second portion 108-2 (i.e., the higher density portion) of the fluid replacement structure 108 is positioned beneath the first portion 108-1 (i.e., the lower density portion) of the fluid replacement structure 108. This specific configuration of the respective density portions facilitates convenient entry and immersion of the computing device within the low density portion of the chamber, particularly where the computing device is placed from an upper opening of the chamber.

Having fluid replacement structures 108 with variable density can make it easier to place the computing devices 106 in the immersion cooling tank 102 than it otherwise would be if the fluid replacement structures 108 had uniform density. To explain why, the type of configuration depicted in FIG. 1A will be compared with (a) a configuration where a fluid replacement structure has uniform density similar to the relatively lower density of the first portion 108-1, and (b) a configuration where a fluid replacement structure has uniform density similar to the relatively higher density of the second portion 108-2.

With configuration (a), the relatively lower density can cause the computing devices 106 to have a tendency to float. This can make it difficult for the computing devices 106 to reach the bottom of the immersion cooling tank 102. In other words, configuration (a) works against placing a computing device 106 in the immersion cooling tank 102. On the other hand, configuration (b) has the opposite problem. With configuration (b), the relatively higher density can cause the computing devices 106 to have a tendency to sink too rapidly. This could cause the computing devices 106 to fall to the bottom of the immersion cooling tank 102 too quickly, potentially causing damage to the computing devices 106 and/or to the immersion cooling tank 102.

In contrast, with the type of configuration depicted in FIG. 1A, the variable density of the fluid replacement structures 108 makes it so that the computing devices 106 can more easily sink all the way to the bottom of the immersion cooling tank 102 but be gentle in doing so. When a computing device 106 is initially placed in the immersion cooling tank 102, the second portion 108-2 (i.e., the relatively higher density portion) of the fluid replacement structure 108 will be the first part of the fluid replacement structure 108 that is submerged in the dielectric working fluid 104. The relatively higher density of the second portion 108-2 of the fluid replacement structure 108 will make it so that the computing device 106 begins to sink to the bottom of the immersion cooling tank 102. However, when the computing device 106 is about halfway submerged in the dielectric working fluid 104, then the first portion 108-1 (i.e., the relatively lower density portion) of the fluid replacement structure 108 will start to be submerged in the dielectric working fluid 104. At this point, the relatively lower density of the first portion 108-1 will start to counteract the relatively higher density of the second portion 108-2, thereby slowing down the speed at which the computing device 106 sinks to the bottom of the immersion cooling tank 102.

The variable density of the fluid replacement structures 108 can be achieved in a variety of different ways. In some embodiments, the second portion 108-2 of the fluid replacement structures 108 can be solid, and the first portion 108-1 of the fluid replacement structures 108 can include at least one empty chamber, thus providing a low cost and convenient mechanism to facilitate the variable density portions within the chamber. In other embodiments, the relatively lower density of the first portion 108-1 of the fluid replacement structures 108 can be created using lightweight plastics such as polypropylene or polyethylene, foam, water, air, and/or other structures (e.g., beads) that can be used during an injection molding process. Examples of high density materials may include metals, dense ceramics, mineral powders, or high density fluids.

FIG. 1A shows one fluid replacement structure 108 attached to each computing device 106. However, this should not be interpreted as limiting the scope of the present disclosure. In some alternative embodiments, more than one fluid replacement structure can be attached to each computing device. In other alternative embodiments, one or more fluid replacement structures can be attached to some of the computing devices in an immersion cooling tank, while other computing devices in the tank may not have any fluid replacement structures attached to them. In other alternative embodiments, fluid replacement structures can be attached to other things in an immersion cooling tank besides computing devices.

There are many different types of attachment mechanisms that can be used to attach the fluid replacement structures 108 to the computing devices 106. In some embodiments, adhesive can be used to attach the fluid replacement structures 108 to the computing devices 106. In other embodiments, one or more fastening mechanisms (e.g., screws, nails, rivets, nuts, bolts) can be used to attach the fluid replacement structures 108 to the computing devices 106.

For simplicity and clarity, only a few computing devices 106 and fluid replacement structures 108 are shown in FIG. 1A. However, this should not be interpreted as limiting the scope of the present disclosure. Those skilled in the art will appreciate that the techniques disclosed herein can be applied to immersion cooling tanks that include a large number of computing devices and a large number of fluid replacement structures. Those skilled in the art will also appreciate that the Figures are not necessarily drawn to scale. Thus, the size of the fluid replacement structures 108 relative to the computing devices 106 may be different than what is shown in FIG. 1A (and elsewhere in the Figures).

In addition to having variable density, the fluid replacement structures 108 also include various other features. Some of these other features can enable the fluid replacement structures 108 to be securely attached to the immersion cooling tank 102. For example, each fluid replacement structure 108 includes a connector 110 that attaches to a mating connector 112 in the immersion cooling tank 102, thereby securing the fluid replacement structure 108 (and the corresponding computing device 106) in place within the immersion cooling tank 102. Of course, the connectors 110 on the fluid replacement structures 108 are not necessarily the only mechanisms for securing the computing devices 106 in place within the immersion cooling tank 102. Other mechanisms that are not shown in FIG. 1A can also be used. Even where other mechanisms are used, however, the connectors 110 on the fluid replacement structures 108 can assist with the objective of securing the computing devices 106 in place in the immersion cooling tank 102.

Each fluid replacement structure 108 also includes a lifting feature 114. In some embodiments, the lifting feature 114 is a structure that can be used to catch, drag, suspend, or fasten something else. For example, the lifting feature 114 on a particular fluid replacement structure 108 can enable the fluid replacement structure 108 and the corresponding computing device 106 to be lifted out of the immersion cooling tank 102 (e.g., by a machine with a robotic arm). In some embodiments, the lifting feature 114 can take the form of a hook or similar structure.

Figure 1B:
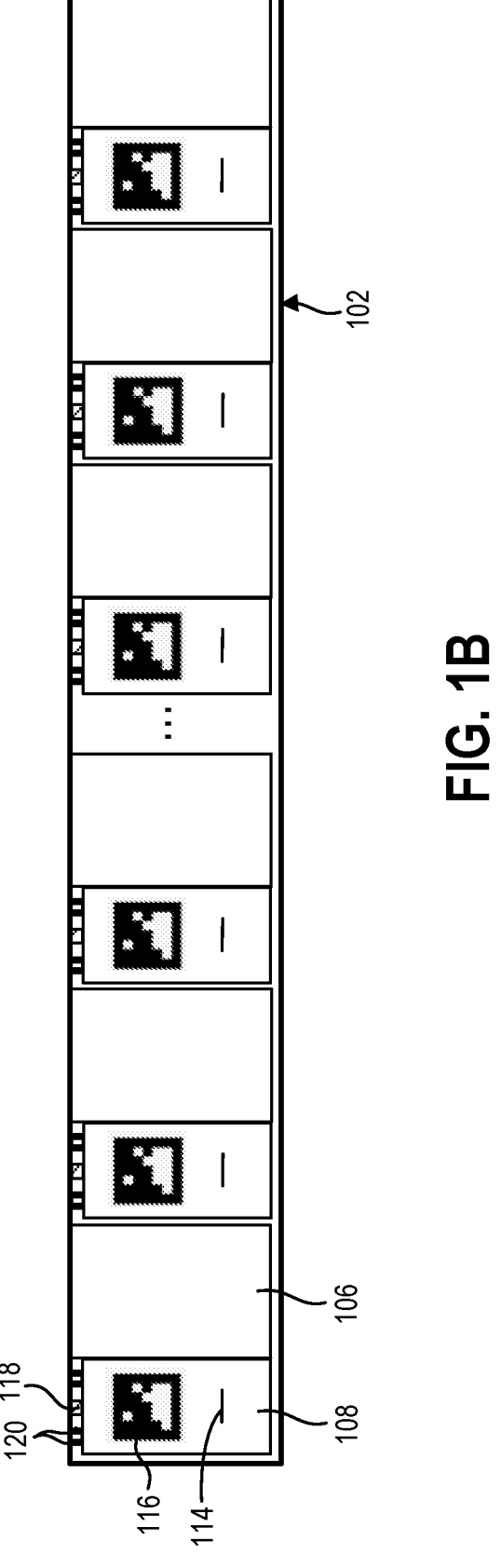
FIG. 1B is a top-down view of the immersion cooling tank shown in FIG. 1A.

FIG. 1B is a top-down view of the immersion cooling tank 102 shown in FIG. 1A. The upper surfaces of the fluid replacement structures 108 and the computing devices 106 are shown in FIG. 1B. The lifting features 114 on the fluid replacement structures 108 are also visible in FIG. 1B.

As shown in FIG. 1B, the fluid replacement structures 108 also include fiducial markers 116. Each fiducial marker 116 is an object that can be used by an imaging system as a point of reference. For example, if a robotic system is going to lift a particular computing device 106 out of the immersion cooling tank 102, an imaging system that is part of (or communicatively coupled to) the robotic system can use the fiducial marker 116 to determine the location of the computing device 106 relative to the robotic system. This can involve capturing an image of the fiducial marker 116 and then comparing the size of the fiducial marker 116 in the image to the actual size of the fiducial marker 116 (which can be known in advance to the imaging system).

In the depicted embodiment, the fiducial marker 116 is shown as a two-dimensional barcode. However, the specific type of fiducial marker 116 shown in FIG. 1B is provided for purposes of example only and should not be interpreted as limiting the scope of the present disclosure. In some embodiments, any object with a recognizable pattern can be used as a fiducial marker.

The fluid replacement structures 108 also include locking features 118. The locking features 118 are configured to be attached to the immersion cooling tank 102 in order to prevent the fluid replacement structures 108 (and the corresponding computing devices 106) from floating in the dielectric working fluid 104.

The fluid replacement structures 108 also include mating guides 120 that match rails within the immersion cooling tank 102. The mating guides 120 are provided to assist with positioning and placement of the computing devices 106 within the immersion cooling tank 102.

In addition to the benefits described above, having the connectors 110, lifting features 114, fiducial markers 116, locking features 118, and mating guides 120 included as part of the fluid replacement structures 108 eliminates the need to attach these structures to the computing devices 106 themselves. This can have the effect of simplifying and reducing the cost of the computing devices 106.

In some embodiments, the connectors 110, lifting features 114, fiducial markers 116, locking features 118, and mating guides 120 can be integral to the fluid replacement structures 108. For example, these structures can be molded into the fluid replacement structures 108 as part of the manufacturing process. Alternatively, in some other embodiments, the connectors 110, lifting features 114, fiducial markers 116, locking features 118, and mating guides 120 can be manufactured separately from the fluid replacement structures 108 and then subsequently attached to the fluid replacement structures 108. Alternatively still, some of the aforementioned components can be integral to the fluid replacement structures 108, while others of the aforementioned components can be manufactured separately from the fluid replacement structures 108 and then subsequently attached to the fluid replacement structures 108.

Figure 2:
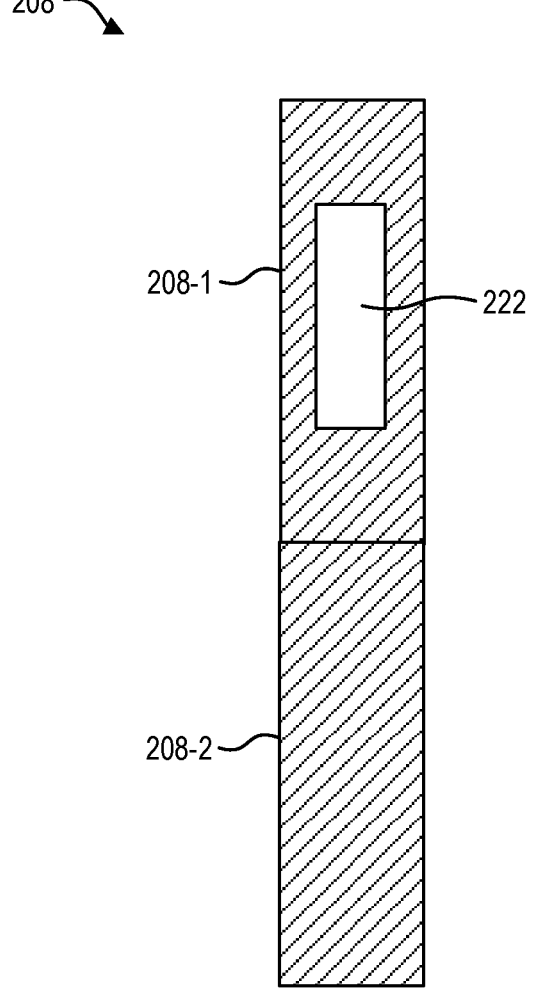
FIG. 2 illustrates another example of a fluid replacement structure that includes variable density.

FIG. 2 illustrates another example of a fluid replacement structure 208. The example shown in FIG. 2 illustrates one way that variable density can be created within a fluid replacement structure 208.

As in the embodiment described previously, the fluid replacement structure 208 includes a first portion 208-1 that has a first density and a second portion 208-2 that has a second density. The density of the second portion 208-2 can be greater than the density of the first portion 208-1.

In the depicted embodiment, the variable density of the fluid replacement structure 208 is achieved through an empty chamber 222 (e.g., at least one empty chamber). In other words, the second portion 208-2 of the fluid replacement structure 208 is solid, and the first portion 208-1 of the fluid replacement structure 208 is solid except for the empty chamber 222.

The shading in FIG. 2 represents a particular density. Thus, the second portion 208-2 of the fluid replacement structure 208 and part of the first portion 208-1 of the fluid replacement structure 208 (i.e., the shaded part) have the same density. However, the presence of the empty chamber 222 makes the first portion 208-1 of the fluid replacement structure 208 have a lower overall density than the second portion 208-2 of the fluid replacement structure 208.

Figure 3:
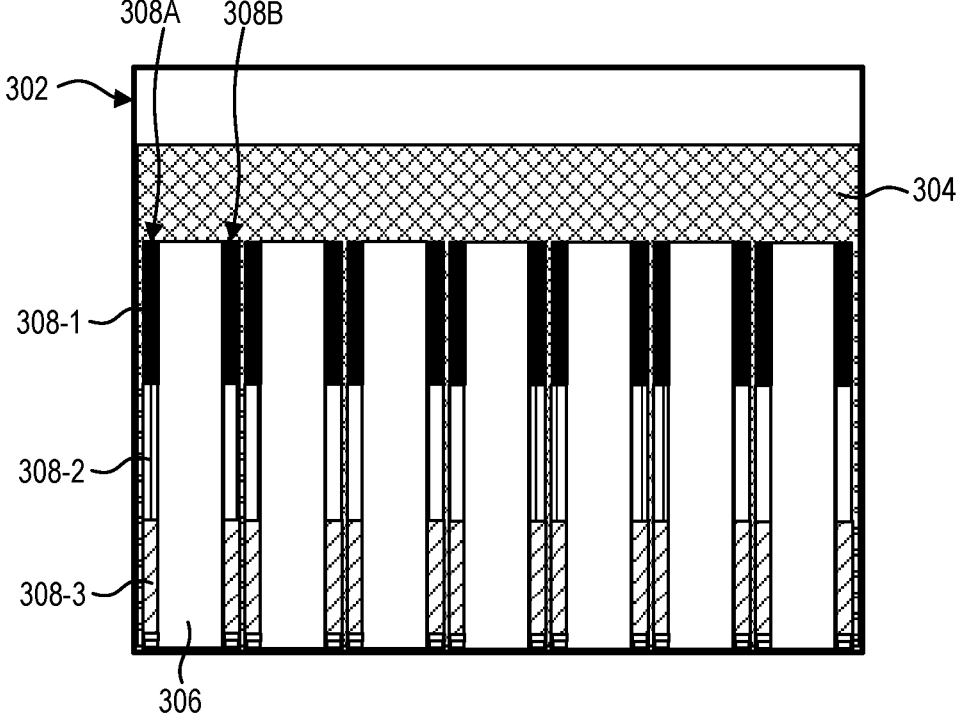
FIG. 3 illustrates another example showing how fluid replacement structures can be utilized in an immersion cooling tank.

FIG. 3 illustrates another example showing how fluid replacement structures 308 can be utilized in an immersion cooling tank 302. The example shown in FIG. 3 is similar in some respects to the example that was described above in connection with FIG. 1A. The immersion cooling tank 302 is configured to retain dielectric working fluid 304. The immersion cooling tank 302 is also configured to retain a plurality of computing devices 306 that are submerged in the dielectric working fluid 304. Fluid replacement structures 308 are attached to the computing devices 306. The fluid replacement structures 308 have variable density. As described above, this can help with buoyancy control, thereby making it easier to place the computing devices 306 in the immersion cooling tank 302 than it otherwise would be if the fluid replacement structures 308 had uniform density.

There are also several differences between the example shown in FIG. 3 and the example shown in FIG. 1A. For instance, in the example shown in FIG. 1A, one fluid replacement structure 108 is attached to each computing device 106. In contrast, in the example shown in FIG. 3, two fluid replacement structures 308A, 308B are attached to each computing device 306. In particular, a first fluid replacement structure 308A is attached to one side of a computing device 306, and a second fluid replacement structure 308B is attached to another side of the computing device 306.

Another difference is related to the number of sections in the fluid replacement structures 308 that have different densities. In the example shown in FIG. 1A, each fluid replacement structure 108 has a first portion 108-1 that has a first density and a second portion 108-2 that has a second density, where the second density is greater than the first density. In contrast, in the example shown in FIG. 3, each fluid replacement structure 308 has a first portion 308-1 that has a first density, a second portion 308-2 that has a second density, and a third portion 308-3 that has a third density. In some embodiments, the density of the second portion 308-2 can be greater than the density of the first portion 308-1, and the density of the third portion 308-3 can be greater than the density of the second portion 308-2.

Taken together, the examples shown in FIG. 1A and FIG. 3 illustrate that fluid replacement structures as disclosed herein can have a varying number of sections with different densities. Moreover, the specific examples described herein should not be interpreted as limiting the scope of the present disclosure. In some alternative embodiments, fluid replacement structures as disclosed herein can have more than three sections with different densities. Alternatively still, in some embodiments, fluid replacement structures may not have discrete sections with varying densities. Instead, the densities of fluid replacement structures can vary continuously (or substantially continuously) from one end of a fluid replacement structure to another.

Another aspect of the present disclosure is related to fluid replacement structures that enable vaporized working fluid to be directed or routed to a desired location. In other words, fluid replacement structures can be designed so that when dielectric working fluid comes into contact with heat-generating component(s) and boils, the flow of the resulting vaporized working fluid is controlled so that it moves to a desired location. For example, the vaporized working fluid can be redirected along a channel that causes the vaporized working fluid to move away from the heat-generating component(s). In some embodiments, the vaporized working fluid can be redirected so that it does not intermix with fresh fluid over one or more other heat-generating component(s).

Figure 4:
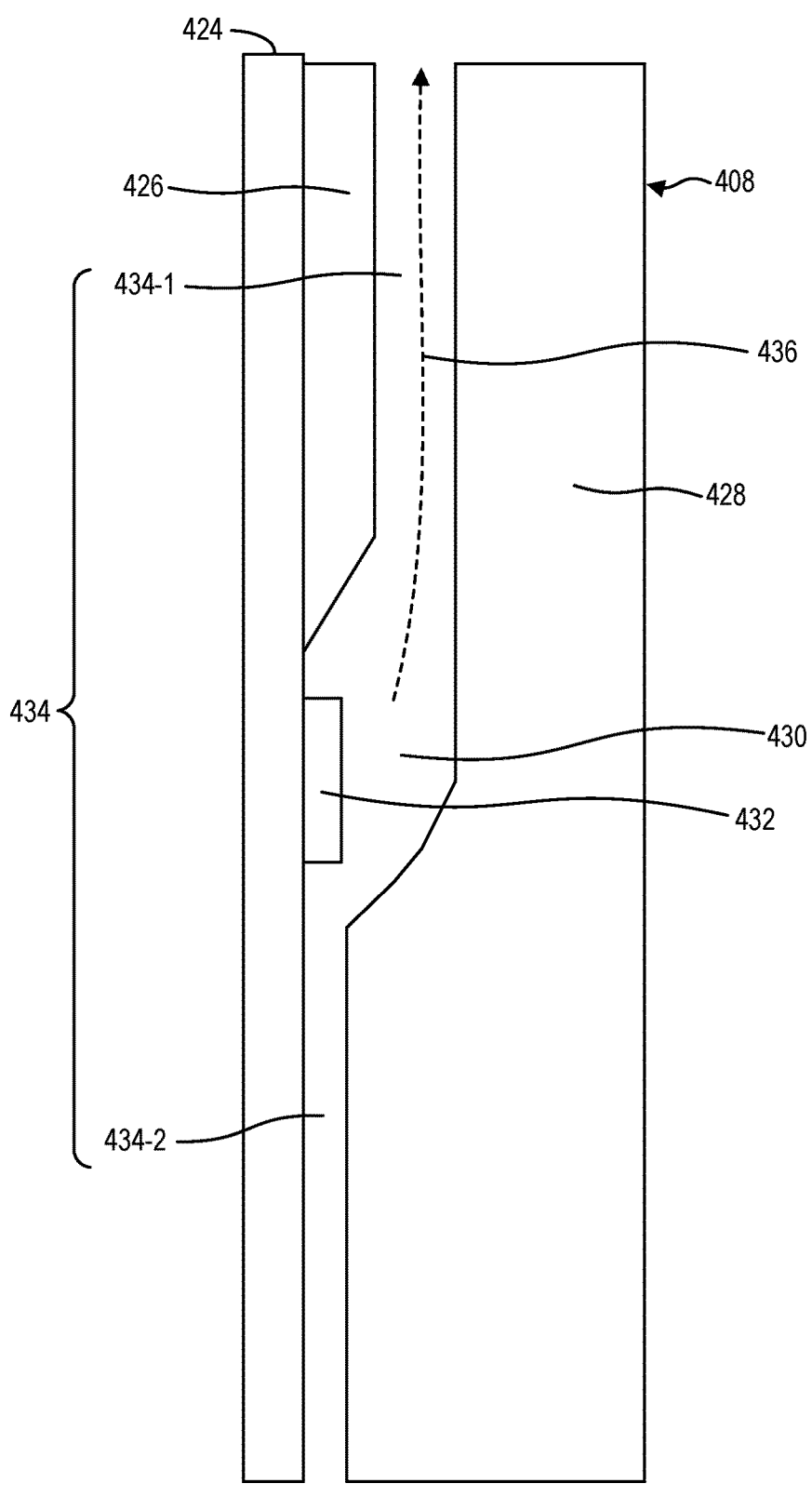
FIG. 4 illustrates an example of a fluid replacement structure that enables vaporized working fluid to be directed to a desired location.

FIG. 4 illustrates an example of a fluid replacement structure 408 that enables vaporized working fluid to be directed to a desired location. The fluid replacement structure 408 is attached to the motherboard 424 of a computing device. The fluid replacement structure 408 includes a side portion 426 and a body portion 428.

The side portion 426 is configured to be directly attached to the motherboard 424. In other words, the side portion 426 of the fluid replacement structure 408 can be coupled or joined to the motherboard 424 without anything located between the side portion 426 and the motherboard 424.

A chamber 430 is formed in the body portion 428 of the fluid replacement structure 408. The chamber 430 is designed so that when the fluid replacement structure 408 is attached to the motherboard 424 (as shown in FIG. 4), a heat-generating component 432 on the motherboard 424 is located in the chamber 430. The heat-generating component 432 can be any computing component that generates heat when in operation. For example, the heat-generating component 432 can be a central processing unit (CPU), another type of processing device, a memory or storage device, or the like.

There is a channel 434 in the body portion 428 of the fluid replacement structure 408. The channel 434 includes a first section 434-1 and a second section 434-2. The channel 434 is configured so that, when the fluid replacement structure 408 is attached to the motherboard 424, the side portion 426 of the fluid replacement structure 408 is positioned between the motherboard 424 and the first section 434-1 of the channel 434, and the second section 434-2 of the channel 434 is adjacent to the motherboard 424. In some implementations, the specific shape and location of the channel 434 and the chamber 430 may be determined, at least in part, by the configuration of the motherboard 424, including the size, shape, and positioning of the heat-generating components 433 on the motherboard. In the example shown in FIG. 4, the location and shape of the channel 434 and the chamber 430 may facilitate manufacturing as well as easily cool heat-generating components located below a CPU.

The channel 434 enables vaporized working fluid to be carried away from the heat-generating component 432. More specifically, the channel 434 is configured so that when the motherboard 424 is submerged in dielectric working fluid and the heat-generating component 432 is in operation (thereby generating heat), the channel 434 enables vaporized working fluid to be directed away from the heat-generating component 432 to an outer portion of the fluid replacement structure 408. For example, at least some of the vaporized working fluid may travel from the heat-generating component 432 in the chamber 430 along the first section 434-1 of the channel 434, as shown by the dotted line 436.

In some implementations, the motherboard 424 and the fluid replacement structure 408 can be placed in an immersion cooling tank so that they are oriented vertically, as shown in FIG. 4. In other implementations, the motherboard 424 and the fluid replacement structure 408 can be placed in an immersion cooling tank so that they are oriented horizontally.

Figure 5:
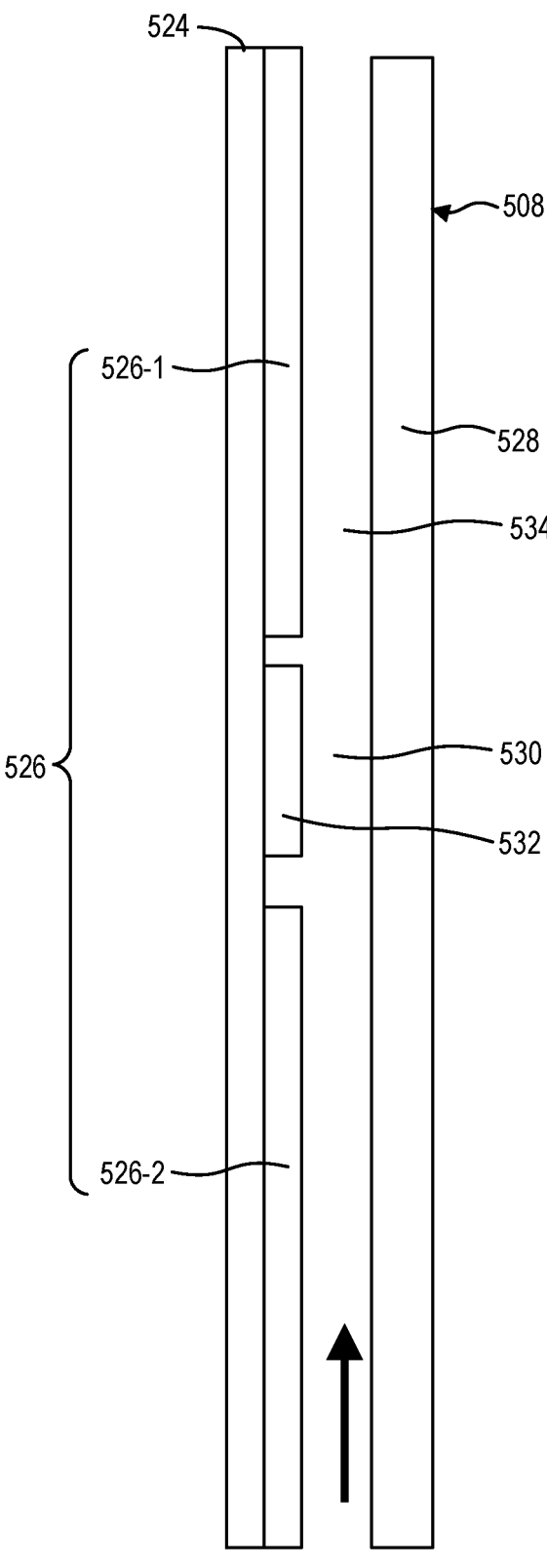
FIG. 5 illustrates another example of a fluid replacement structure that enables vaporized working fluid to be directed to a desired location.

FIG. 5 illustrates another example of a fluid replacement structure 508 that enables vaporized working fluid to be directed to a desired location. The fluid replacement structure 508 is similar in some respects to the fluid replacement structure 408 that was described above in connection with FIG. 4. The fluid replacement structure 508 is attached to the motherboard 524 of a computing device. The fluid replacement structure 508 includes a side portion 526 and a body portion 528. A chamber 530 is formed in the body portion 528 of the fluid replacement structure 508. The chamber 530 is designed so that when the fluid replacement structure 508 is attached to the motherboard 524 (as shown in FIG. 5), a heat-generating component 532 on the motherboard 524 is located in the chamber 530. There is a channel 534 in the body portion 528 of the fluid replacement structure 508. The channel 534 enables vaporized working fluid to be carried away from the heat-generating component 532.

There are also several differences between the fluid replacement structure 508 shown in FIG. 5 and the fluid replacement structure 408 shown in FIG. 4. In the fluid replacement structure 408 shown in FIG. 4, the channel 434 includes a first section 434-1 and a second section 434-2. In contrast, in the fluid replacement structure 508 shown in FIG. 5, the channel 534 does not include different sections. Instead, the channel 534 just includes a single section that runs parallel to the length of the fluid replacement structure 508.

Also, in the fluid replacement structure 508 shown in FIG. 5, the side portion 526 includes two different sections: a first section 526-1 and a second section 526-2. The heat-generating component 532 is positioned between these sections 526-1, 526-2. When the motherboard 524 and the fluid replacement structure 508 are placed in an immersion cooling tank and oriented vertically, as shown in FIG. 5, the heat-generating component 532 is positioned underneath the first section 526-1 of the side portion 526 and above the second section 526-2 of the side portion 526.

The channel may provide a pathway for cool (e.g., liquid, unevaporated) working fluid 427 to reach the heat-generating component 532. As before, the channel 534 enables vaporized working fluid to be carried away from the heat-generating component 532.

Figures 1, 6:
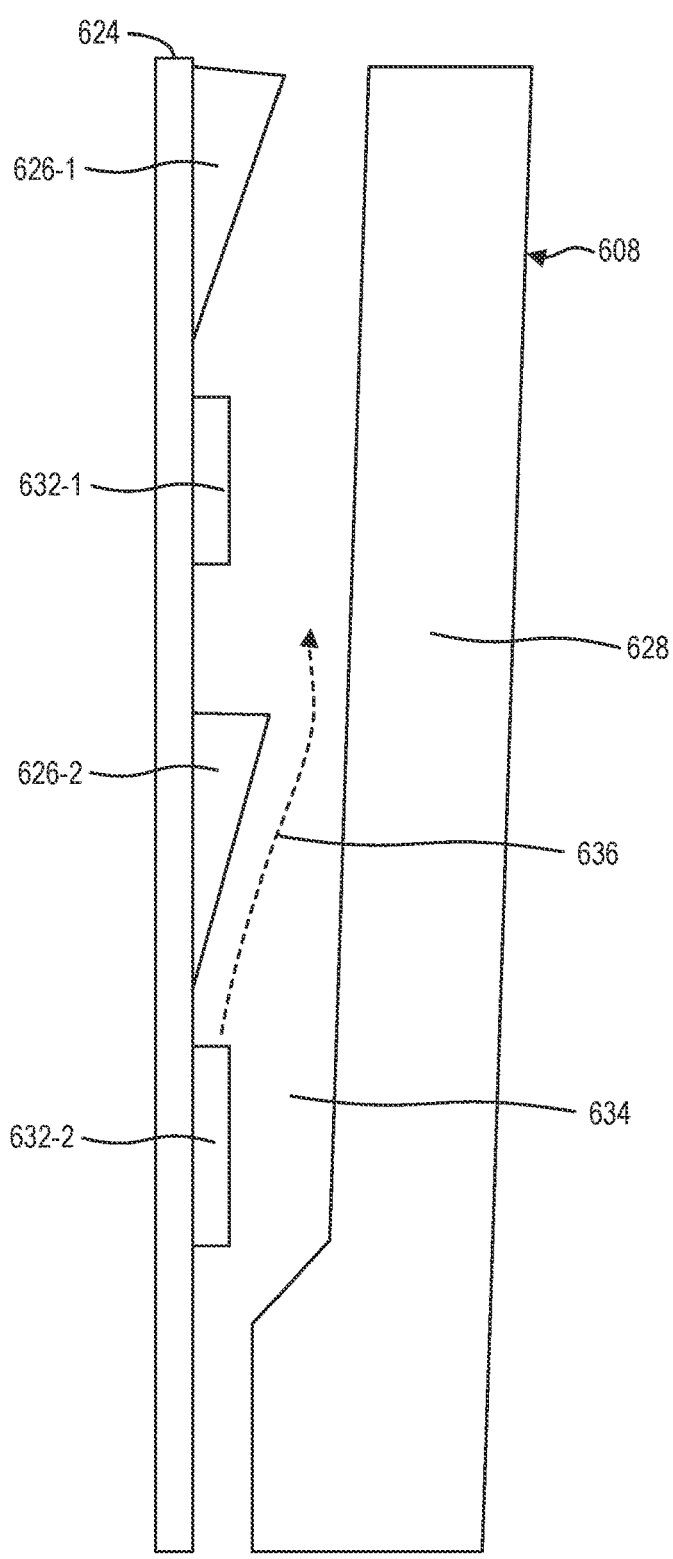
FIG. 6-1 illustrates another example of a fluid replacement structure that enables vaporized working fluid to be directed to a desired location.
Figures 2, 6:
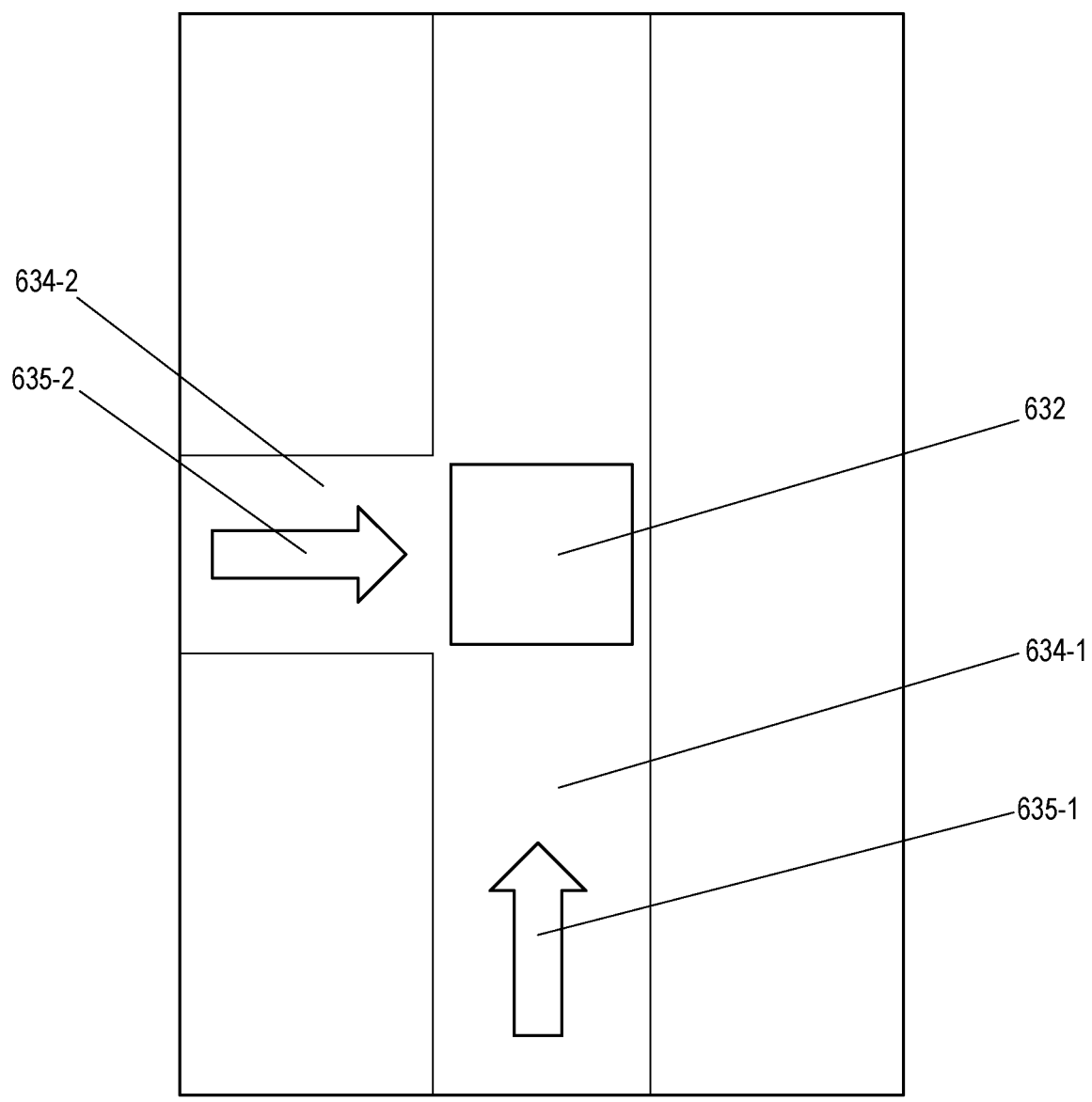

FIG. 6-1 illustrates another example of a fluid replacement structure 608 that enables vaporized working fluid to be directed to a desired location. In the depicted embodiment, the fluid replacement structure 608 is designed for use with a motherboard 624 that includes a plurality of different heat-generating components 632-1, 632-2.

The fluid replacement structure 608 is similar in some respects to the fluid replacement structures 408, 508 that were described above in connection with FIGS. 4 and 5. The fluid replacement structure 608 is attached to the motherboard 624 of a computing device. The fluid replacement structure 608 includes a side portion 626 and a body portion 628. The side portion 626 of the fluid replacement structure 608 includes a first section 626-1 and a second section 626-2. There is a channel 634 in the body portion 628 of the fluid replacement structure 608.

There are also several differences between the fluid replacement structure 608 shown in FIG. 6-1 and the fluid replacement structures 408, 508 described previously. As noted above, the motherboard 624 includes a plurality of different heat-generating components 632-1, 632-2. The heat-generating components 632-1, 632-2 are oriented so that the first heat-generating component 632-1 is positioned above the second heat-generating component 632-2 when the motherboard 624 is placed in an immersion cooling tank and oriented vertically (as shown in FIG. 6-1).

As before, the channel 634 enables vaporized working fluid to be carried away from the heat-generating components 632-1, 632-2. In addition, the fluid replacement structure 608 is configured so that the first heat-generating component 632-1 is shielded from the vaporized working fluid that comes from the second heat-generating component 632-2. In particular, the second section 626-2 of the body portion 626 of the fluid replacement structure 608 is positioned between the first heat-generating component 632-1 and the second heat-generating component 632-2. This has the effect of diverting the vaporized working fluid that comes from the second heat-generating component 632-2 away from the first heat-generating component 632-1, as shown by the dotted arrow 636. If the second section 626-2 of the body portion 626 were not in place as shown in FIG. 6-1, then vaporized working fluid from the second heat-generating component 632-2 would rise up and probably come into contact with the first heat-generating component 632-1. This would likely interfere with the cooling of the first heat-generating component 632-1.

Both the first section 626-1 and the second section 626-2 of the body portion 626 of the fluid replacement structure 608 have a triangular shape. In some implementations, the triangular shape of the first section 626-1 and the second section 626-2 may help to prevent the collection of bubbles of evaporated working fluid at the body portion 626. However, it should be understood that any shape of the first section 626-1 or the second section 626-2 may be used.

In the implementation shown in FIG. 6-2, cooling fluid may flow to the heat-generating component 632 in any direction. For example, a vertical channel 634-1 (e.g., parallel to the force of gravity) may direct a first portion 635-1 of cooling fluid to the heat-generating component 632. A horizontal channel 634-2 that is oriented transverse (e.g., not parallel) to the force of gravity may direct a second portion 635-2 to the heat-generating component 632. This may allow more cooling fluid to reach the heat-generating component 632. In some implementations, multiple paths or channels 634 may be directed to the heat-generating component 632.

Another aspect of the present disclosure is related to fluid replacement structures that are configured with one or more emergency cooling features. For example, in some embodiments, a fluid replacement structure can include a plurality of different substances that, when mixed together, cause an endothermic reaction to occur. The endothermic reaction can be triggered when the temperature in the immersion cooling tank reaches a certain point that is close to the maximum safe operating temperature for the computing devices in the tank. The endothermic reaction should have the effect of cooling the immersion cooling tank.

Figure 7A:
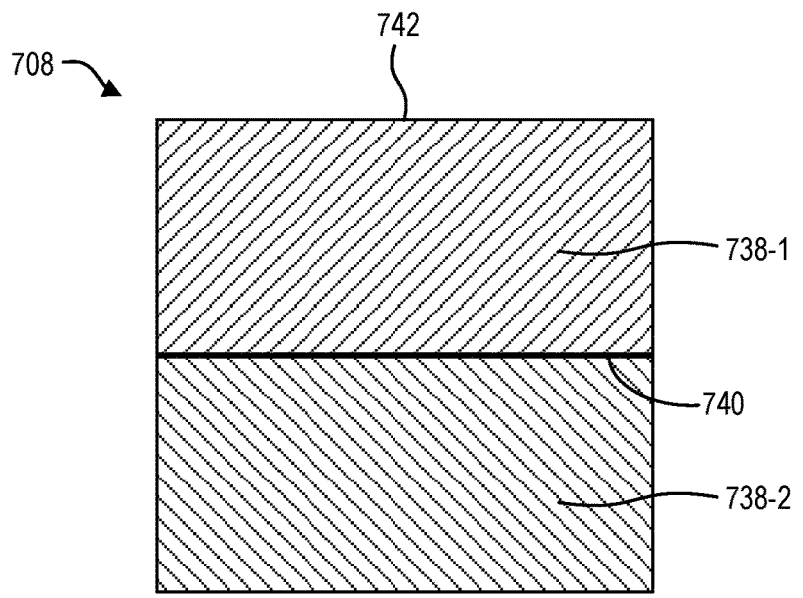
FIGS. 7A and 7B illustrate an example of a fluid replacement structure that can be used in an immersion cooling tank and that is configured with an emergency cooling feature.
Figure 7B:
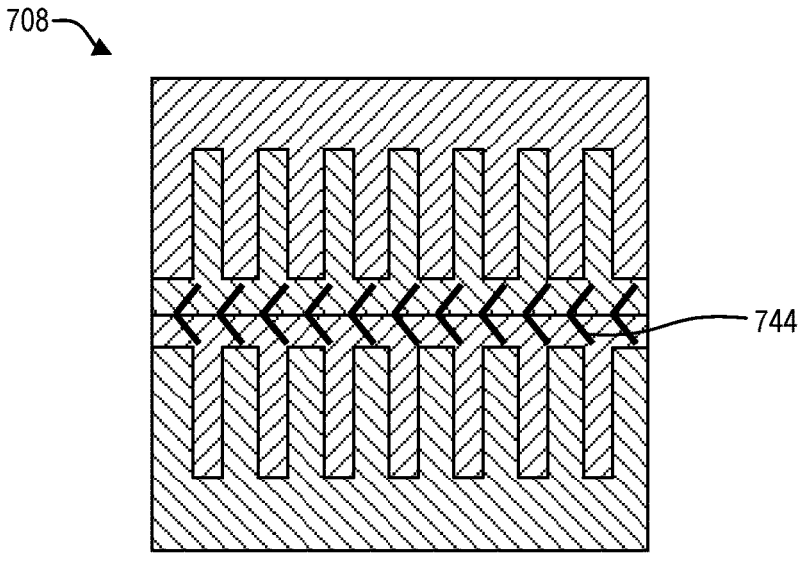

FIGS. 7A and 7B illustrate an example of a fluid replacement structure 708 that can be used in an immersion cooling tank and that is configured with an emergency cooling feature.

Reference is initially made to FIG. 7A, which shows the fluid replacement structure 708 with a first chamber 738-1 and a second chamber 738-2. The first chamber 738-1 includes a first substance, and the second chamber 738-2 includes a second substance that is different from the first substance. The substances are selected so that an endothermic reaction occurs when the first substance is mixed with the second substance. In some implementations, an endothermic reaction may include mixing barium hydroxide-octahydrate and ammonium-chloride. In some implementations, an endothermic reaction may include mixing thionyl-chloride ($SOCl2$) and cobalt(II)-sulfate-heptahydrate. In some implementations, an endothermic reaction may include mixing water with ammonium nitrate or potassium chloride. In some embodiments, any endothermic reaction may be utilized.

The fluid replacement structure 708 includes a housing 742. A membrane 740 creates the first chamber 738-1 and the second chamber 738-2. With the membrane 740 in place, the first substance in the first chamber 738-1 is kept separate from the second substance in the second chamber 738-2. However, the membrane 740 has a melting point that is close to the maximum safe operating temperature for the computing devices in the immersion cooling tank. When the temperature inside the immersion cooling tank reaches the melting point of the membrane 740, the membrane 740 melts, thereby causing the first substance in the first chamber 738-1 to mix with the second substance in the second chamber 738-2. This causes an endothermic reaction to occur.

FIG. 7B shows the fluid replacement structure 708 after the membrane 740 has melted and the first substance in the first chamber 738-1 has been mixed with the second substance in the second chamber 738-2. The resulting substance 744, which is shown in FIG. 7B, is a mixture of the first substance and the second substance. When these two substances are mixed together, this causes an endothermic reaction to occur. The endothermic reaction should cause the temperature inside the immersion cooling tank to be lowered, which should also lower the temperature of the computing devices inside the immersion cooling tank.

In some embodiments, the membrane 740 can be chosen so that the melting point of the membrane 740 satisfies two constraints. First, the membrane 740 can be chosen so that the melting point of the membrane 740 is greater than the boiling point of the dielectric working fluid in the immersion cooling tank. Second, the membrane 740 can be chosen so that the melting point of the membrane 740 is less than the thermal limit (discussed below) of the components in the computing devices in the immersion cooling tank.

The first constraint allows the membrane 740 to remain in place separating the first chamber 738-1 and the second chamber 738-2 when the temperature of the dielectric working fluid gets hot enough to boil. This prevents the endothermic reaction from being triggered too soon, at a point in time when it is not desirable.

The second constraint is related to the thermal limit of the components in the computing devices (e.g., heat-generating components such as CPU, memory, storage). These components have a thermal limit for safe operation. When the temperature of a component exceeds its thermal limit, the component may become damaged. It is desirable for the melting point of the membrane 740 to be less than this thermal limit so that the temperature of the immersion cooling tank does not increase to a point where the components inside the tank become damaged.

In the depicted embodiment, the fluid replacement structure 708 is a fluid replacement block having a rectangular shape. The first chamber 738-1 is positioned above the second chamber 738-2. In addition, the density of the first substance in the first chamber 738-1 is greater than the density of the second substance in the second chamber 738-2. This makes it easier for the substances to mix together after the membrane 740 melts.

Figure 8:
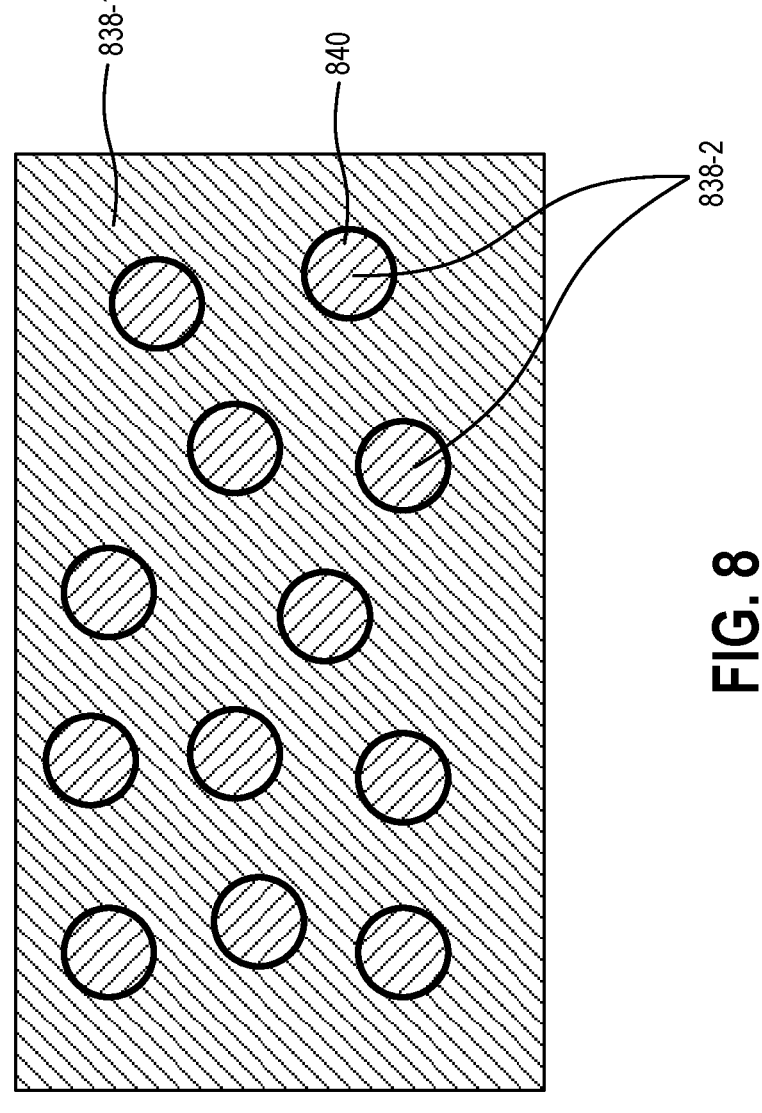
FIG. 8 illustrates another example of a fluid replacement structure that can be used in an immersion cooling tank and that is configured with an emergency cooling feature.

FIG. 8 illustrates another example of a fluid replacement structure 808 that can be used in an immersion cooling tank and that is configured with an emergency cooling feature. Like the fluid replacement structure 708 that was described above in connection with FIGS. 7A and 7B, the fluid replacement structure 808 shown in FIG. 8 includes different substances that are kept separate from one another by a membrane with a melting point that is slightly below the thermal limit of the computing components in the immersion cooling tank.

In the depicted embodiment, however, the fluid replacement structure 808 includes a chamber 838-1 and a plurality of capsules 838-2 that are positioned inside the chamber 838-1. A first substance is included in the chamber 838-1, and a second substance is included in the capsules 838-2. The substances are selected so that an endothermic reaction occurs when the substances are mixed together.

Each capsule 838-2 includes an outer portion that comprises a membrane 840. With the membrane 840 in place, the first substance in the chamber 838-1 is kept separate from the second substance in the capsules 838-2. However, like the membrane 740 described previously, the membrane 840 has a melting point that is close to the maximum safe operating temperature for the computing devices in the immersion cooling tank. When the temperature inside the immersion cooling tank reaches the melting point of the membrane 840, the membrane 840 melts, thereby causing the second substance in the capsules 838-2 to be released and mix with the first substance in the chamber 838-1. This causes an endothermic reaction to occur, which should cause the temperature inside the immersion cooling tank to be lowered.

Both the fluid replacement structure 708 shown in FIGS. 7A and 7B and the fluid replacement structure 808 shown in FIG. 8 have a first chamber, at least one second chamber, and a membrane separating the first chamber and the second chamber(s). In the fluid replacement structure 708 shown in FIGS. 7A and 7B, there is a first chamber 738-1 and a second chamber 738-2 separated by a membrane 740. In the fluid replacement structure 808 shown in FIG. 8, the chamber 838-1 is the first chamber, and each of the capsules 838-2 can be thought of as a second chamber. A membrane 840 separates the contents of a particular capsule 838-2 from the contents of the chamber 838-1.

In accordance with another aspect of the present disclosure, a fluid replacement structure can provide structural support for an immersion cooling tank under some circumstances. For example, in some embodiments, a fluid replacement structure can provide structural support for an immersion cooling tank when negative pressure operations are performed on the immersion cooling tank.

Figure 9A:
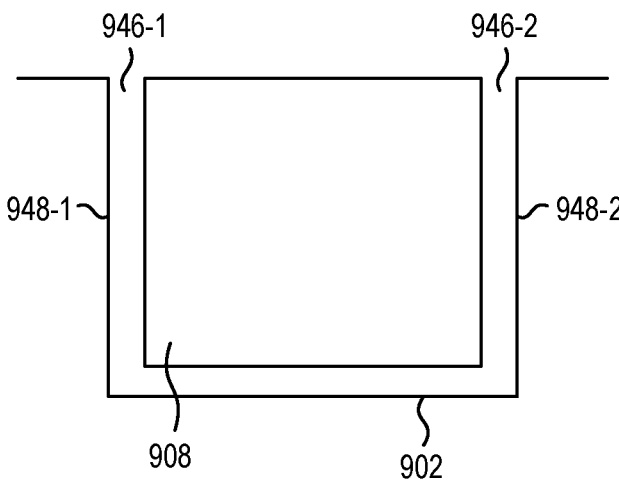
FIGS. 9A and 9B illustrate an example of a fluid replacement structure that is configured to provide structural support for an immersion cooling tank.
Figure 9B:
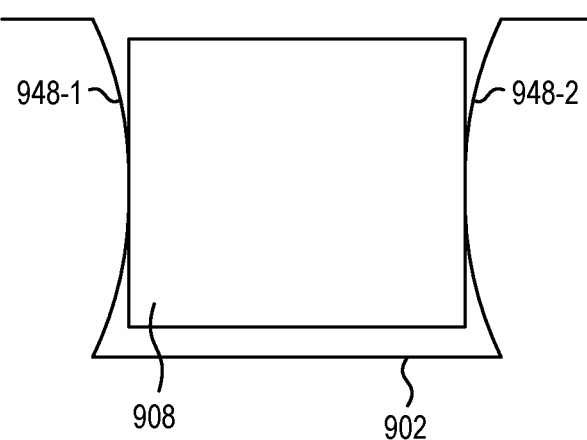

FIGS. 9A and 9B illustrate an example of a fluid replacement structure 908 that is configured to provide structural support for an immersion cooling tank 902. FIG. 9A illustrates the immersion cooling tank 902 before negative pressure operations are performed on the immersion cooling tank 902. FIG. 9B illustrates the immersion cooling tank 902 while negative pressure operations are being performed on the immersion cooling tank 902.

Referring to FIG. 9A, before negative pressure operations are performed on the immersion cooling tank 902, there are gaps 946-1, 946-2 between the fluid replacement structure and the walls 948-1, 948-2 of the immersion cooling tank 902. When negative pressure operations are performed on the immersion cooling tank 902, the walls 948-1, 948-2 of the immersion cooling tank 902 tend to move inward, as shown in FIG. 9B. This effect is sometimes referred to as "oil canning." This causes the gaps 946-1, 946-2 between the fluid replacement structure and the walls 948-1, 948-2 to disappear. However, the presence of the fluid replacement structure 908 can prevent the walls 948-1, 948-2 from "oil canning" any further.

In accordance with another aspect of the present disclosure, a fluid replacement structure can function as a case for one or more computing devices that are placed in an immersion cooling tank. The case could be used during shipping and also during operation in an immersion cooling tank to prevent movement and potentially damaging flexing of the computing device within the immersion cooling tank. The case could be made of a rigid material, which would also prevent flexing and deformation of the motherboard itself, improving reliability in an immersion cooling tank. Electromagnetic interference (EMI) control could be accomplished through the use of a Faraday cage around (or molded into) the fluid replacement structure, thin coatings, plated surfaces, or through the use of conductive materials (or layers) in the fluid replacement structure itself.

Figure 10:
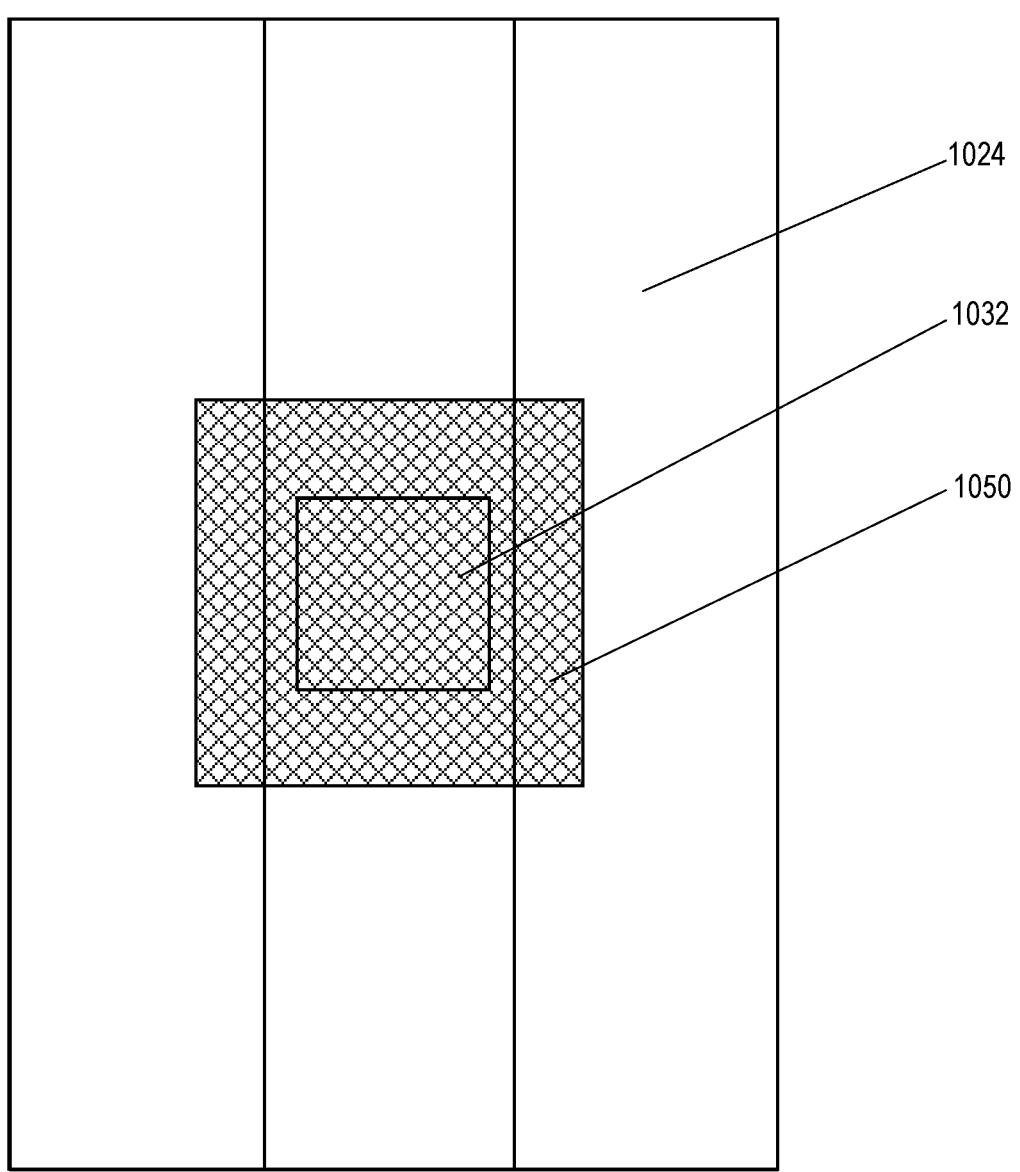
FIG. 10 illustrates an example of a fluid replacement structure that includes an EM shield.

For example, as may be seen in FIG. 10, an EM shield 1050 has been placed over or around the heat-generating component 1032. The EM shield 1050 may be any type of shield, such as a Faraday cage. In some implementations, the EM shield 1050 may be secured to the motherboard 1024 at any location. For example, the EM shield 1050 may surround a single heat-generating component 1032. In some examples, the EM shield 1050 may surround multiple heat-generating components 1032. In some examples, the EM shield 1050 may surround an entire motherboard 1024.

Another aspect of the present disclosure is related to the use of cooled fluid recirculation jetting passages. In some embodiments, a low-mount fluid input can be used on an immersion cooling tank to inject colder, filtered fluid into a passage on the fluid replacement structure to route to the hottest areas on the motherboard. There could also be a dedicated cooling loop to pre-chill fluid and add it back in at critical locations on the motherboard.

Figure 11:
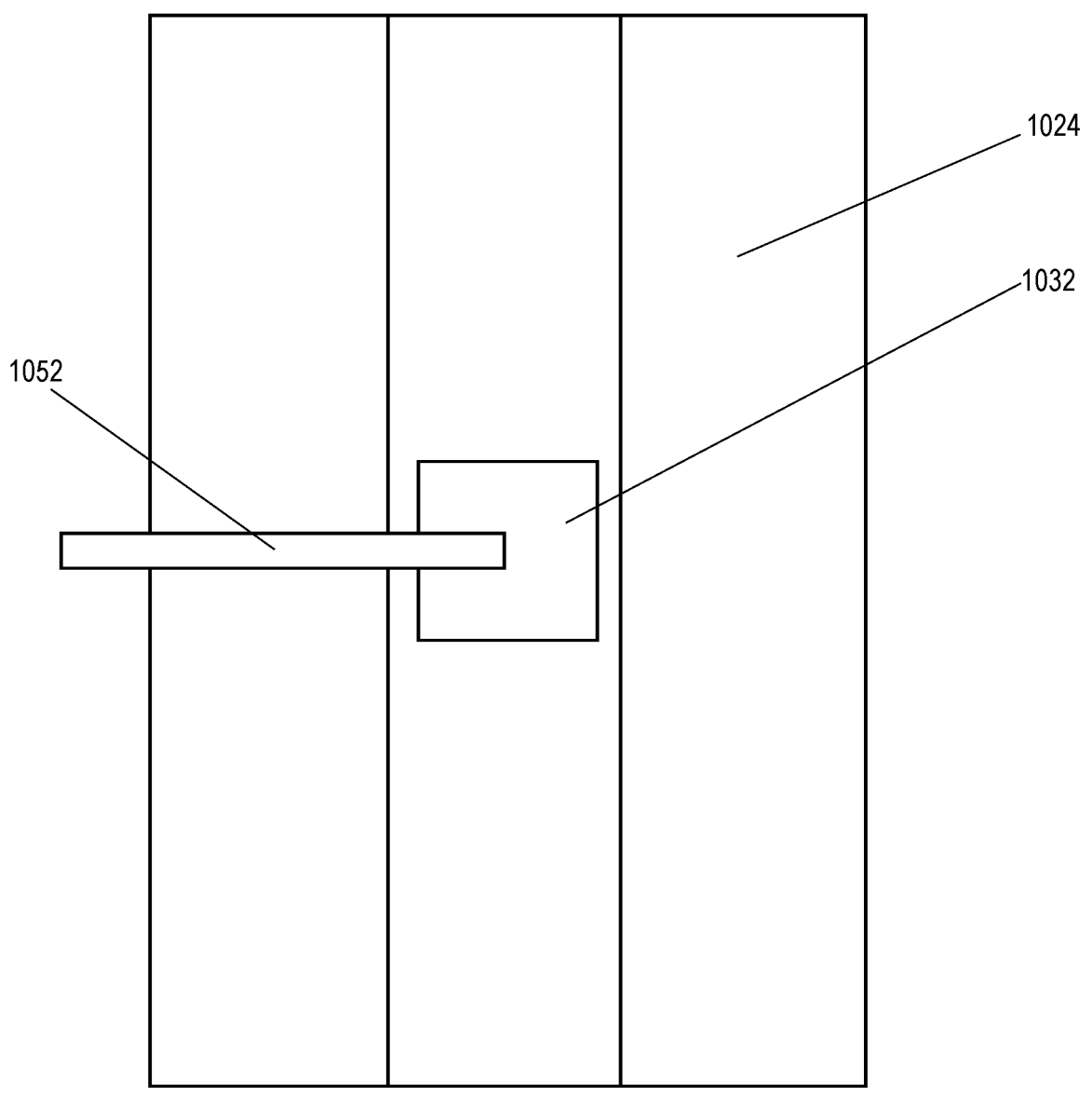
FIG. 11 illustrates an example of a fluid replacement structure that includes a fluid passage directing fluid to a particular location.

For example, as may be seen in FIG. 11, a passage 1152 may direct cooling fluid directly to certain portions of the motherboard 1124. In some implementations, the passage 1152 may direct the cooling fluid directly to one or more heat-generating components 1132. For example, the passage 1152 may direct the cooling fluid to a high heat flux chip. This may help to provide additional cooling to high heat areas of the motherboard 1124. In some embodiments, the passage 1152 and/or the cooling fluid inside the passage 1152 may have a higher pressure than the surrounding fluid. This may help to direct the cooling fluid to the heat-generating component 1132. In some embodiments, the passage 1152 may provide cooling fluid that has been pre-cooled relative to the remaining fluid.

The term "immersion cooling tank" (or simply "cooling tank" or "tank") may refer to any container that is sufficiently large and sturdy to retain a plurality of computing devices that are submerged in dielectric working fluid. An immersion cooling tank that is used in a two-phase immersion cooling system may be capable of being sealed so that vaporized working fluid does not escape from the immersion cooling tank.

The term "dielectric working fluid" (or simply "working fluid") may refer to any nonconductive fluid in which computing devices can be submerged for the purpose of cooling the computing devices. Some examples of dielectric working fluids that can be used include synthetic fluids, fluorocarbon-based fluids, mineral oil, and deionized water. A dielectric working fluid may have a relatively low boiling point (e.g., 40-50° C.), such that heat generated by computing devices causes the dielectric working fluid to boil.

The term "communicatively coupled" refers to coupling of components such that these components are able to communicate with one another through, for example, wired, wireless, or other communications media. The term "communicatively coupled" can include direct, communicative coupling as well as indirect or "mediated" communicative coupling. For example, a component A may be communicatively coupled to a component B directly by at least one communication pathway, or a component A may be communicatively coupled to a component B indirectly by at least a first communication pathway that directly couples component A to a component C and at least a second communication pathway that directly couples component C to component B. In this case, component C is said to mediate the communicative coupling between component A and component B.

The term "determining" (and grammatical variants thereof) can encompass a wide variety of actions. For example, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The phrase "based on" does not mean "based only on," unless expressly specified otherwise. In other words, the phrase "based on" describes both "based only on" and "based at least on."

In the above description, reference numbers have sometimes been used in connection with various terms. Where a term is used in connection with a reference number, this may be meant to refer to a specific element that is shown in one or more of the Figures. Where a term is used without a reference number, this may be meant to refer generally to the term without limitation to any particular Figure.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A fluid replacement structure for use in an immersion cooling tank that is configured to retain dielectric working fluid and that is also configured to retain a plurality of computing devices that are submerged in the dielectric working fluid, the fluid replacement structure comprising:

a first portion that is configured to be attached to a first portion of a computing device, the first portion of the fluid replacement structure having a first density;

a second portion that is configured to be attached to a second portion of the computing device, the second portion of the fluid replacement structure having a second density that is greater than the first density; and at least one connector that attaches to a mating connector in the immersion cooling tank to secure the fluid replacement structure and the computing device to the immersion cooling tank.

2. The fluid replacement structure of claim 1, wherein the second portion of the fluid replacement structure is positioned beneath the first portion of the fluid replacement structure when the fluid replacement structure and the computing device are placed in the immersion cooling tank.

3. The fluid replacement structure of claim 1, wherein:

the second portion of the fluid replacement structure is solid; and the first portion of the fluid replacement structure comprises at least one empty chamber.

4. The fluid replacement structure of claim 1, further comprising a lifting feature that enables the fluid replacement structure and the computing device to be lifted out of the immersion cooling tank.

5. The fluid replacement structure of claim 1, further comprising a fiducial marker.

6. The fluid replacement structure of claim 1, further comprising a locking feature that is configured to be attached to the immersion cooling tank to prevent the fluid replacement structure and the computing device from floating.

7. The fluid replacement structure of claim 1, wherein the fluid replacement structure further comprises mating guides that match rails on a side wall of the immersion cooling tank.

8. The fluid replacement structure of claim 1, wherein the fluid replacement structure functions as a case for the computing device.

9. The fluid replacement structure of claim 1, wherein the first portion and the second portion are fixed directly to the computing device.

10. The fluid replacement structure of claim 1, wherein the density of the first portion is less than a density of the dielectric working fluid, and wherein the density of the second portion is greater than the density of the dielectric working fluid.

11. A fluid replacement structure for use in an immersion cooling tank that is configured to retain dielectric working fluid and that is also configured to retain a plurality of computing devices that are submerged in the dielectric working fluid, the fluid replacement structure comprising:

a side portion that is configured to be directly attached to a motherboard of a computing device, the motherboard also comprising a first heat-generating component;

a body portion;

a chamber in the body portion of the fluid replacement structure, wherein the first heat-generating component is located in the chamber when the fluid replacement structure is attached to the motherboard; and a channel in the body portion of the fluid replacement structure, the channel being configured to direct vaporized working fluid away from the first heat-generating component to an outer portion of the fluid replacement structure when the motherboard is submerged in the dielectric working fluid and the first heat-generating component is in operation.

12. The fluid replacement structure of claim 11, wherein when the fluid replacement structure is attached to the motherboard:

the side portion of the fluid replacement structure is positioned between the motherboard and a first section of the channel; and a second section of the channel is adjacent to the motherboard.

13. The fluid replacement structure of claim 11, wherein the channel is parallel to a length of the fluid replacement structure.

14. The fluid replacement structure of claim 11, wherein:

a second heat-generating component is also attached to the motherboard;

the first heat-generating component is positioned above the second heat-generating component when the computing device is placed in the immersion cooling tank; and a section of the body portion of the fluid replacement structure is positioned between the first heat-generating component and the second heat-generating component, thereby diverting the vaporized working fluid that comes from the second heat-generating component away from the first heat-generating component.

15. The fluid replacement structure of claim 11, wherein the side portion is positioned on the motherboard vertically above the first heat-generating component.

16. The fluid replacement structure of claim 11, wherein the channel is positioned vertically above the chamber.

17. The fluid replacement structure of claim 11, wherein the channel is configured to direct vaporized working fluid laterally away from the first heat-generating component.

18. A fluid replacement structure for use in an immersion cooling tank that is configured to retain dielectric working fluid and that is also configured to retain a plurality of computing devices that are submerged in the dielectric working fluid, the plurality of computing devices comprising components that have a thermal limit for safe operation, the fluid replacement structure comprising:

a first chamber;

a second chamber;

a membrane separating the first chamber and the second chamber, the membrane having a melting point that is greater than a boiling point of the dielectric working fluid and less than the thermal limit of the components in the plurality of computing devices;

a first substance within the first chamber; and a second substance within the second chamber, wherein the first chamber is positioned above the second chamber in the fluid replacement structure, wherein the second substance has a lower density than the first substance,-wherein melting of the membrane causes the first substance to mix with the second substance, and wherein mixing the first substance and the second substance causes an endothermic reaction to occur that lowers a temperature of the dielectric working fluid in the immersion cooling tank.

19. The fluid replacement structure of claim 18, wherein:

the fluid replacement structure comprises a plurality of second chambers that are positioned inside the first chamber; and an outer portion of each of the plurality of second chambers comprises the membrane.

20. The fluid replacement structure of claim 19, wherein the plurality of second chambers comprise a plurality of capsules.

* * * * *